United States Patent [19]

Herndon et al.

[11] 4,027,383

[45] June 7, 1977

[54] INTEGRATED CIRCUIT PACKAGING

[75] Inventors: Terry O. Herndon, Carlisle; Jack I. Raffel, Lexington, both of Mass.

[73] Assignee: Massachusetts Institute of Technology, Cambridge, Mass.

[22] Filed: July 16, 1975

[21] Appl. No.: 596,472

Related U.S. Application Data

[63] Continuation of Ser. No. 436,299, Jan. 24, 1974, abandoned.

[52] U.S. Cl. .................................. 29/577; 29/588; 29/591
[51] Int. Cl.² .......................................... B01J 17/00
[58] Field of Search ................. 29/576 S, 583, 588, 29/591, 577

[56] References Cited

UNITED STATES PATENTS 3,262,022  7/1966  Carracciolo ..................... 29/576 S
3,771,219  11/1973  Tuzi ..................................... 29/583

*Primary Examiner*—W. Tupman
*Attorney, Agent, or Firm*—Arthur A. Smith, Jr.; Martin M. Santa; Robert Shaw

[57] ABSTRACT

Lead connections and packaging for integrated circuits are formed by processing elongated ribbon arrays of integrated circuit dice in groups prior to cutting the ribbon along its length to free the discrete integrated circuit products. The ribbon is adhered to the base of an elongated channel having at least one leg containing implanted lead-in conductors arranged therein as an axial series of axial arrays of conductors. The axial arrays are aligned with the circuits on the ribbons and interconnections therebetween are formed as photolithographically defined conductive coatings on a top surface of the ribbon extending from bonding pads of the integrated circuit to exposed conductor ends at a top end(s) of the leg(s). The channel/ribbon assembly is cut into discrete circuits after forming such interconnections for all the circuits of the ribbon as a group. Each array of lead-in conductors is packed in high density and fans out from the channel to an array of low density lead-out conductors which may be plugged into sockets or otherwise macroscopically treated.

15 Claims, 8 Drawing Figures

INTEGRATED CIRCUIT PACKAGING

THE INVENTION

The invention herein described was made in the course of work performed under a contract with the Electronic Systems Division, Air Force Systems Command, United States Air Force.

This is a continuation of application Ser. No. 436,299 filed Jan. 24, 1974, now abandoned.

BACKGROUND OF THE INVENTION

The present invention relates to production of integrated circuits and the like and more particularly relates to integrated circuit lead connection and packaging.

It is known in the electronic component packaging art to set an integrated circuit die between lead frames and make interconnections between bonding pads on the integrated circuit die and corresponding lead-in conductors of such lead frames, one well-known version of this technique being called "dual-in-line packaging [DIP]". The lead-in conductor arrays of high density packing in an axial series fan out to a corresponding low density array of lead-out conductors also in an axial series and coplanar with respect to the lead-in conductor arrays or bent with respect thereto.

The state of the art is characterized by the need for manual work in making the above interconnections between integrated circuit dice and their respective lead-in conductors, problems of registration and orientation tolerance maintenance balancing reliability and yield economics, and useless expenditure of lead connection and packaging effort and cost to condition an integrated circuit for testing which might be rejected for faults intrinsic to the integrated circuit itself.

It is an important object of the present invention to provide improvements in integrated circuit production avoiding one or more of the above cited disadvantages.

It is a further object of the invention to reduce the amount of manual handling implicit in such production consistent with the preceding object.

It is a further object of the invention to improve the reliability of lead connection and packaging consistent with one or both of the preceding objects.

It is a further object of the invention to provide automatic alignment aids consistent with one or more of the preceding objects.

It is a further object of the invention to reduce scatter from die to die in registration and orientation tolerances consistent with one or more of the preceding objects.

It is a further object of the invention to provide improved DIP-like packaging consistent with one or more of the preceding objects.

It is a further object of the invention to reduce the number 8 integrated circuit handling steps involved in packaging and lead connection production consistent with one or more of the preceding objects.

SUMMARY OF THE INVENTION

According to the invention integrated circuits are formed in axial arrays on ribbon substrates. The ribbons may be formed as Czochralski grown single crystal ingots which are sliced and processed to produce a grid of integrated circuits and then diced in one direction to produce long ribbons, but not diced in the orthogonal direction to break out discrete dice.

Elongated channels of dielectric material having a base and at least one leg, and preferably two legs to form a U-shape cross-section, are produced with an axial series of axial arrays of lead-in conductors in the leg(s) of the channel. The lead-in conductors extend upwardly through the leg to a buss connector which is also implanted in the leg and also extends downwardly and out below the channel base to fan out into corresponding arrays of lead-out conductors. The lead-out conductors may be coplanar with respect to their corresponding lead-in conductors or slightly bent or offset with respect thereto.

The lead-out conductors are of sufficiently low density for macroscopic scale handling and the lead-in conductor arrays are of sufficiently low density for fitting essentially the same axial lengths as the dice to be produced and connected thereto. The ratio of such axial packing densities is from 2:1 to 6:1, preferably 2.5:1. The lead-out conductors are interconnected at their remote ends by buss connectors. Alignment means are formed on or within one or both of the lead-out conductor buss connector and the lead-in buss connectors. The channel is preferably molded about the lead-in conductors and their buss connector, if any, but the implantation of conductors within the channel may be carried out by other means. After performing the implantation, portion of the leg(s) is cut off leaving exposed ends of the lead-in conductors along the exposed end of the leg(s) and the cutoff is made to a height to leave the channel height essentially equal to thickness of the above described ribbon plus any necessary thickness allowance for adhesive.

The ribbon is adhered to the channel base along a bottom face of the ribbon and bonding pads of the integrated circuit appear on the exposed upper face of the ribbon. The ribbon side edge(s) butts the sides of the channel. Coated conductive paths are formed on the surface of the ribbon and exposed leg(s) to interconnect lead-in conductor ends with pads. The coatings are defined by photoimaging methods such as those described in copending U.S. patent application Ser. No. 251,754 filed May 9, 1972, by Guditz et al., of common assignment herewith and the disclosure of which is incorporated herein by reference as though set out at length herein. Such connector production can be automated and, in any event, is free of the painstaking manual work of prior art interconnection methods. Only a single registration with the photographic means need be performed and that registration serves for all of the integrated circuits along the length of the ribbon. As used herein, "ribbon" includes pluralities of ribbons mounted end-to-end and/or in spaced parallel array with each such component ribbon being assembled with a channel as described above.

In the course of such connector production, the alignment means on the lead-out conductors may be used for axial registration purposes and conveying. After completion of the interconnection processing the connectors of the lead-out conductors may be cut away and such conductors can be used for testing by attaching test probes thereto, to test the integrated circuits without removing them from the ribbon/channel assembly. After such testing, the ribbon/channel assembly is cut along boundary lines between the integrated circuits to break out discrete packaged products each comprising an integrated circuit die imbedded in a dielectric channel with conductive interconnection paths running along a top surface of the die to exposed conductor edges on a top surface of one or more channel legs. This discrete product may be encapsulated in epoxy or other conventional component packaging material to form a final package. The lead-out conductors fan out from the bottom of the channel and out through the bottom of the final package instead of fanning out through the final package sides as in many conventional packaging systems.

In ordinary semiconductor device production, circuits are statically tested while still in wafer form and then re-tested after packaging. By the use of technique described herein, circuits need only be tested once, after lead attachment when it is possible to test both static and dynamic characteristics.

Other objects, features and advantages of the invention will be apparent from the following detailed description of preferred embodiments thereof, taken in connection with the accompanying drawing in which:

DETAILED DESCRIPTION OF PREFERRED EMBODIMENTS

Figure 1:
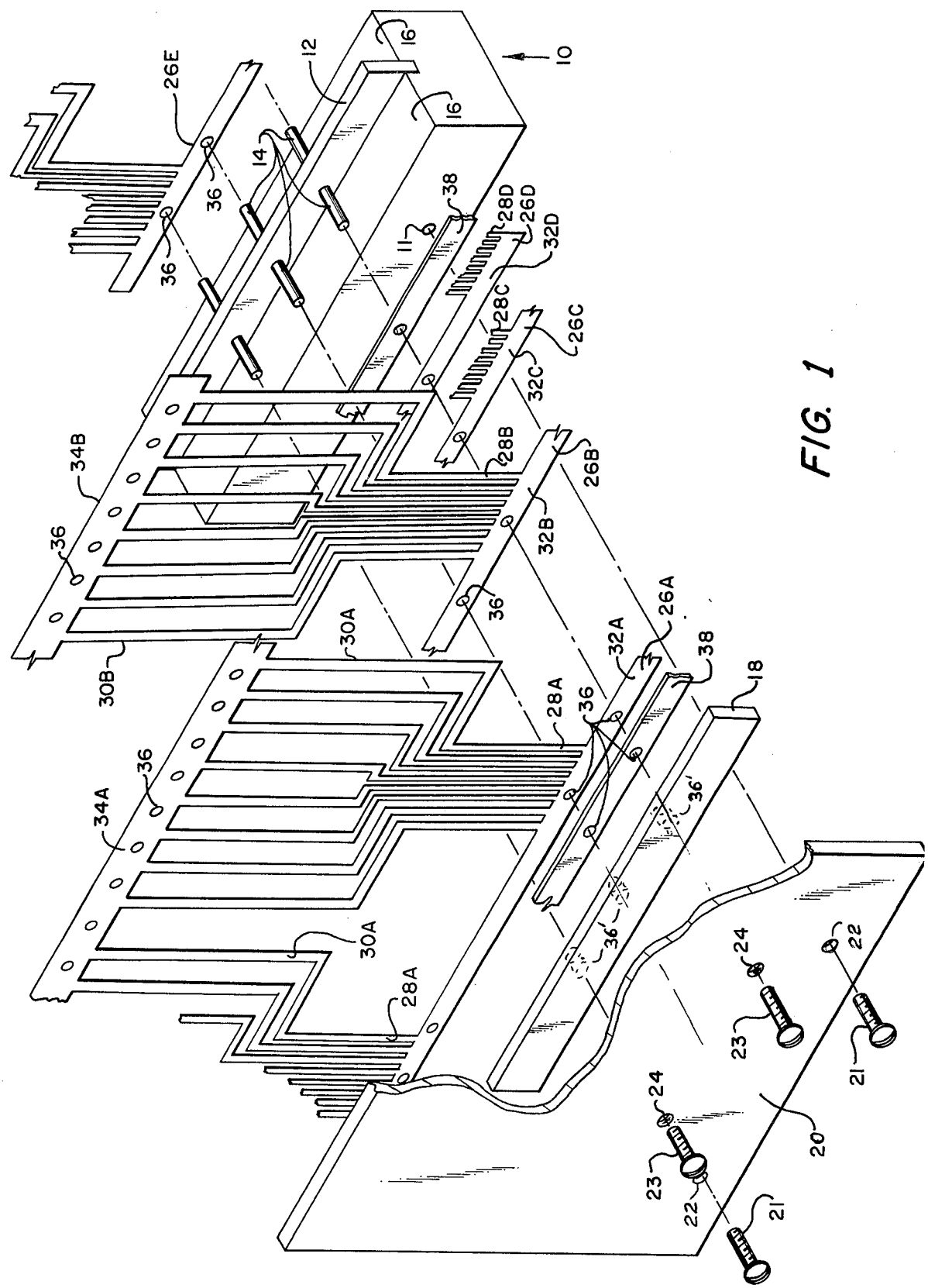
FIG. 1 is an isometric exploded view of a portion of materials and multiple part mold equipment used in practice of a preferred embodiment of the invention.
Figure 2:
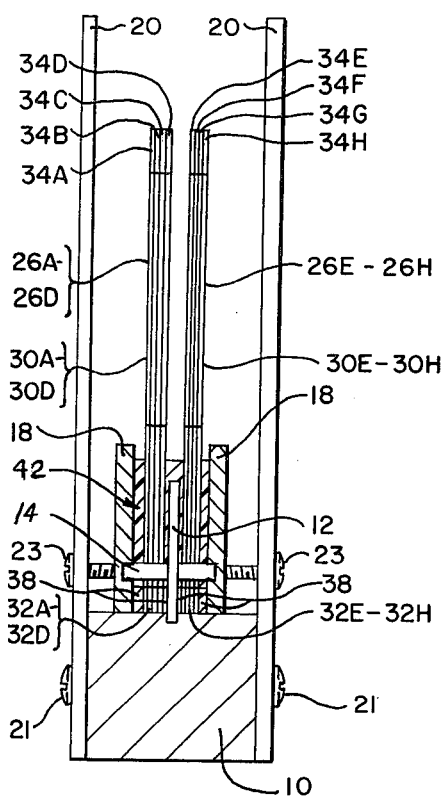
FIG. 2 is a cross-sectional view of the assembled mold showing lead-in and lead-out conductors and the molded channel.

Referring now to FIG. 1 there is shown a mold 10 with an upstanding central section 12 having alignment pins 14 extending out of both faces thereof. The mold also has tie down holes 11, whose function is described in connection with push plates described below. The mold has shoulders to form base surfaces 16. The base surfaces 16, the side faces central section 2 and the top face of central section 12 are all coated with a fluoroplastic mold release agent such as a Teflon coating. The mold also comprises pusher plates 18 with alignment holes 36' part way through to fit over alignment pins 14. Tie down screws 21 can be passed through holes 22 of plates 20 and into threaded holes 11 of section 10 to form a mold assembly as shown in FIG. 2. Screws 23 pass through threaded holes 24 of plates 20 which constitute side walls of the assembled mold to bear against pusher plates 18.

Returning to FIG. 1 the exploded assemblage further comprises a number of conductor assemblies 26A, 26B, 26C, 26D, and many similar conductor assemblies on one side of the center portion of the mold and a similar arrangement of conductor means on the other side of the center section of the mold. (Not shown excepting a portion of one such conductor means 26E). Each such assembly has axial arrays of high density lead-in conductors 28A, 28B, 28C, 28D and arrays of low density lead-out conductors as indicated, for example, at 30A, 30B.

These conductor assemblies may be stamped from strip stock using punch press methods or produced by photoresist definition, exposure, development and etchings in thickness of 5–10 mils, as elongated repeating series of axial arrays of high density packed lead-in conductors 28A, 28B, et seq., and corresponding fanned out arrays 30A, 30B, 30C, 30D of lead-out conductors. Buss connectors 32A, 32B, 32C, 32D, interconnect the lead-in conductors of each assembly. Similar buss connectors 34A, 34B, 34C, 34D connect the lead-out conductors of each assembly. Alignment holes 36 are provided in the buss connectors to fit on alignment pins 14. Spacer bars 38, with alignment holes 36, are also provided. The conductor assembly specifications are determined by integrated circuit die size, number of electrical connections required and socket dimensions. Each high density array of lead-in conductors corresponds to ½ the number of electrical connections on each die and has an axial length equal to die length. The lead-out conductors are fanned out to sufficiently low density to mate with conventional sockets. The conductor material is preferably 5 to 10 mil beryllium - copper foil or gold plated kovar foil with gold plated lead-out conductor ends (adjacent the buss connector of lead-out conductors), Referring again to FIG. 2, the assembled mold and conductor assemblies clamp assemblies 26A–26D together and assemblies 26E–26H together on opposite sides of the mold center section 12. Their respective buss connectors 34A–34H are on top of the conductor assemblies and the connectors 32A–32H are on bottom of the assemblies.

The spacers 38 leave room for molding between assemblies 26A–26D and pusher plate 18, between assemblies 26A–26D and a left wall of mold section 12, between assemblies 26E–26H and a right wall of mold section 12 and between assemblies 26E–26H and pusher plate 18. Low viscosity photosensitive polyester resin, such as Rohm & Hass P43 Paraplex resin, is photosensitized and pumped between plates 18 to fill the mold to a height of about 25 mils above the top of center section 12 and exposed to ultraviolet light, and heated to cure in the form of a channel 40. The mold is then taken apart and supplemental curing applied as necessary.

Figure 3:
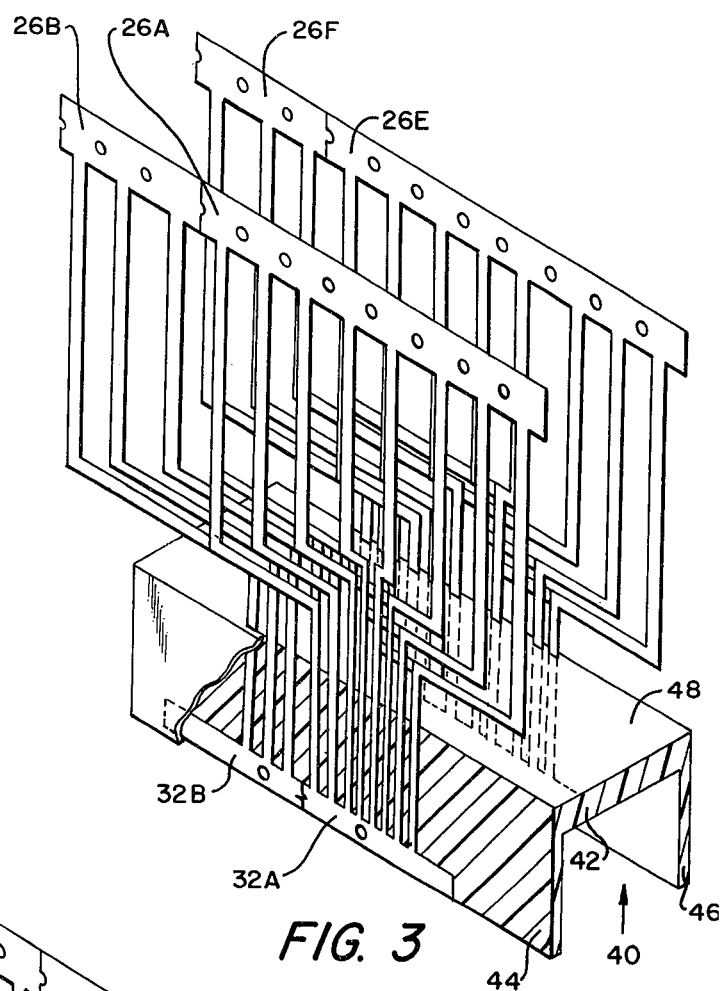
FIG. 3 is an isometric view of the channel, with lead-in conductors therein, removed from the mold, at an early stage of processing.

FIG. 3 shows the channel 40 encapsulating four conductor assemblies 26A, 26B, 26E, 26F. It will be understood however, that several more such assemblies will be encapsulated. The channel comprises a base 42 and legs 44 and 46, a bottom surface 48 of the base.

Figure 4:
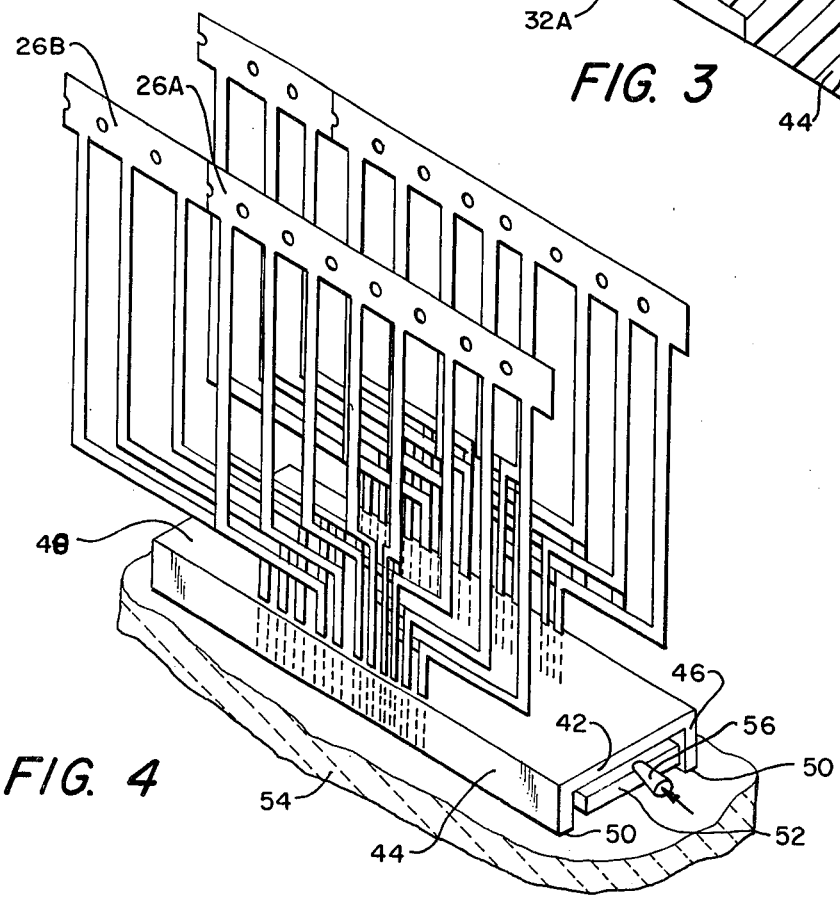
FIG. 4 is an isometric view of a portion of the channel assembled with a ribbon.

The legs are cut short to expose new top surfaces 50, FIG. 4, which trims away buss connectors 32A, 32B, 32C, 32D and leaves lead-in conductors extending from surfaces 50 through legs 44, 46 and out through base 42 and fanning out into their corresponding lead-out arrays. The channel 40 is assembled with a silicon ribbon 52 and placed face down on a release agent coated, glass plate 54 over the ribbon. The silicon ribbon is cut as a lengthwise strip from a wafer having a grid array of dice. Lateral indentations are etched along the ribbon between integrated circuits to define boundaries therebetween. The channel 40 is typically made 10–20 mils wider than, and 6 to 10 mils deeper than, the ribbon 52.

An injection nozzle 56 is inserted into the space between channel and strip and is used to inject ultraviolet curable, low viscosity, polyester resin into the spacing to fill it. Dams are provided at the ends of such spacing to prevent resin runout. Then ultraviolet light is projected through the transparent channel 40 and the assembly is heated to cure the polyester adhesive. The assembly is then removed from the glass and turned over and appears as shown in FIG. 5.

Figure 5:
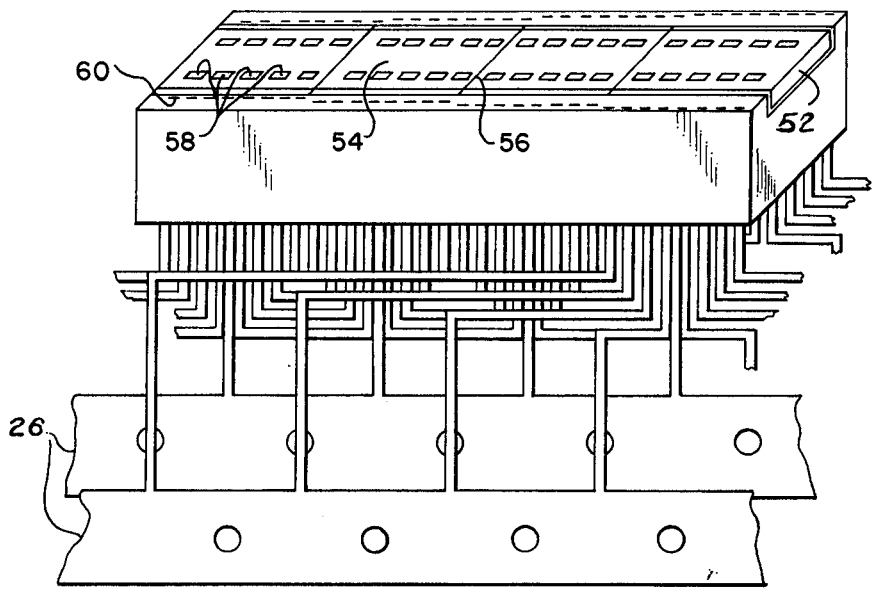
FIG. 5 is an isometric view of the channel/ribbon assemblage of FIG. 4 turned over and at a later stage of processing.

FIG. 5 also shows the top surface of the ribbon 52 including four exemplary dice 54, containing integrated circuits thereon, separated by etched boundary lines 56. Each side die has bonding pads 58 in two rows along its sides corresponding to the near axial array of exposed ends 60 of the lead-in conductors.

Figure 6:
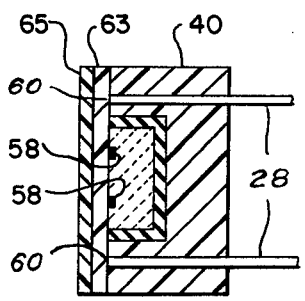
FIG. 6 and 7 are cross-section views of the ribbon/channel assembly showing two steps in the formation of electrical interconnections.
Figure 7:
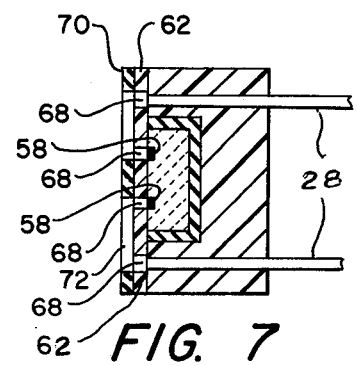

FIGS. 6 and 7 are partial cross-section views of the FIG. 5 assembly at later stages of processing to produce lateral interconnections between the pads 58 and the lead-in conductor ends 60. First a liquid polyester layer 63 is applied over the upper surface of the silicon ribbons 52 and lead-in conductor ends 60. Then a thin polyester sheet 65, Mylar, is placed over the wet polyester and a photomask (not shown) is pressed against the sheet thereby pressing the liquid polyester layer into a 3 or 4 mil thickness over the silicon ribbon and channel. The photomask is then aligned to the silicon ribbon circuit pads 58 and the lead-in conductor ends 60. Using intense ultra-violet light, the polyester is exposed through the photomask, curing the resin where the light impinges on it. The photo-mask is removed, the sheet stripped off, and the unexposed areas of the polyester are washed away. This leaves a polyester layer 62 over the face of the entire silicon ribbon and channel except for the via holes 68 which lie directly over the channel leg ends and silicon ribbon circuit pads.

Another polyester layer 70 (FIG. 7) is deposited over layer 62 and similarly trated to produce lateral channels 72 spanning the lateral distance from via holes 68 over pads 58 to via holes over conductor ends 60.

Then the top of the assembly is metal plated under conditions enabling the metal to penetrate and fill channels 72 and holes 68 to form lateral interconnections between the pads and conductor ends. The plated top surface of layer 70 is abraded away to remove all metal and electrically isolate the lateral interconnection paths from each other. The buss connectors 26A–26H are removed.

Electrical testing may be done at this stage of deferred. If done at this stage, dielectric foils are inserted between butting overlapping arrays of lead-out conductors, and test leads can be attached to the two arrays of lead-out conductors opposing each other and axially centered on opposite sides of a given die. Such measurements are useful in making decisions with regard to further processing. If a high percentage of the circuits are defective the whole assembly may be rejected or further processing investment may be limited to the good dice.

Figure 8:
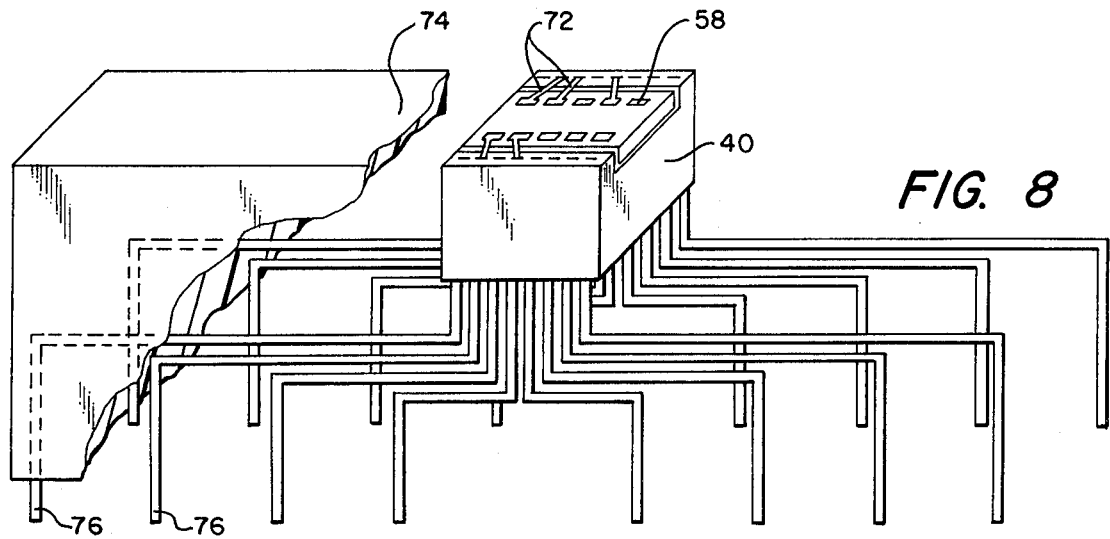
FIG. 8 is a discrete integrated circuit packaged product cut from the assemblage of FIG. 5.

The ribbon/channel assembly is sliced along the boundary lines 56 to produce discrete packaged dice as shown in FIG. 8. Each such die is seated in a U-shaped channel and straddled by channel legs. A lead-in conductor array passes through each of the channel legs and out through the channel base to fan out into a lead-out conductor array 30. This assemblage is further encapsulated in a conventional semiconductor packaging epoxy or other high strength, moisture resistant plastic. A portion of the encapsulating block is indicated in solid outline and sectioning at 74. Outer ends 76 of lead-out conductors 30 remain exposed for insertion into sockets.

Channels 72 have a filling of metal to define lateral connections between the metal filled via holes over circuit bonding pads and the metal filled via holes over lead-in conductor ends. The unit product of FIG. 8 can be tested before or after encapsulation in block 74. An epoxy or other casting resin may be used in place of polyester for producing the channel 40.

It is evident that those skilled in the art, once given the benefit of the foregoing disclosure, may now make numerous other uses and modifications of, and departures from the specific embodiments described herein without departing from the inventive concepts. Consequently, the invention is to be construed as embracing each and every novel feature and novel combination of features present in, or possessed by, the apparatus and techniques herein disclosed and limited solely by the scope and spirit of the appended claims.

We claim:

1. Integrated circuit production method comprising,
   forming an elongated channel or dielectric material having at least one leg and a base, each extending in the same direction to define an axis, the planes of said leg and base being orthogonal,
   implanting in said leg a plurality of high density arrays of lead-in conductors extending orthogonally to said base through said leg and terminating with exposed ends in a plane parallel to the base, each array being axially displaced from each other to be non-overlapping and each array comprising a plurality of lead-in conductors,
   each of said lead-in conductor arrays comprising a low density lead-out conductor array connected thereto, said lead-out arrays being axially displaced from each other to be partially overlapping,
   adhering to said base an elongated semiconductor ribbon containing a plurality of circuit means each on a die and each containing multiple pads, the pads being in the same plane as said lead-in conductor ends,
   each array of lead-in conductors being no longer than the length of each die along said axis, each die being laterally displaced and axially aligned with an array of lead-in conductors,
   said dies being separated by laterally extending boundary lines,
   forming electrical interconnections between an each array of lead-in conductor exposed ends and laterally displaced circuit pads of each of the axially aligned lead-in conductor arrays and circuit means, respectively,
   and dividing the channel-ribbon assembly along said boundary lines to define discrete packages each containing a circuit means die with a circuit therein and an array of lead-out conductors therefor interconnected with the circuit by its connected array of lead-in conductors.

2. Integrated circuit production method in accordance with claim 1 wherein said channel is formed with two legs in U-shaped cross-section and comprises said plurality of said lead-in conductor arrays in both legs.

3. Integrated circuit production method in accordance with claim 1 and further comprising,
   weakening the ribbon at said boundary lines prior to bonding the ribbon to the channel base.

4. Integrated circuit production method in accordance with claim 3 wherein said boundary lines are scribed.

5. Integrated circuit production method in accordance with claim 1 and further comprising,
the step of encapsulating said lead-in conductors and said ribbon before cutting said assembly.

6. Integrated circuit production method in accordance with claim 1 wherein said lead-out conductor arrays are arranged coplanar with their respective lead-in conductor arrays.

7. Integrated circuit production method in accordance with claim 6 and further comprising,
forming at least axially adjacent lead-out conductor arrays to partially overlap each other,
thereby packing more than one lead-in conductor array in the axial distance required by a single lead-out conductor array.

8. Integrated circuit production method in accordance with claim 7 and further comprising,
forming buss connectors to connect the lead-in conductors of each array and to connect axially adjacent arrays of lead-in conductors,
axially aligning holes in said buss connectors to space said arrays of lead-in conductors in the course of implanting, and
removing said buss connectors after implanting.

9. Integrated circuit production method in accordance with claim 8 wherein said implanting comprises molding said channel leg about the lead-in conductor arrays.

10. Integrated circuit production method in accordance with claim 1 wherein said implanting comprises molding said channel leg about the lead-in conductor arrays.

11. Integrated circuit production method in accordance with claim 1 and further comprising,
weakening the ribbon at said boundary lines prior to bonding the ribbon to the channel base,
the step of encapsulating said lead-in conductors before cutting said assembly,
forming at least axially adjacent lead-out conductor arrays to partially overlap each other,
forming buss connectors between axially adjacent arrays of lead-in conductors.

12. Integrated circuit production method in accordance with claim 1 and further comprising,
forming ribbons of semiconductive material and forming an axial array of circuits with bonding pads thereon along sides of the ribbon.

13. Integrated circuit production method in accordance with claim 2 wherein said ribbons are monocrystalline.

14. Integrated circuit production method in accordance with claim 13 and further comprising,
forming a single crystal ingot, slicing it and cutting ribbons from said slices.

15. Integrated circuit production method in accordance with claim 12 wherein said interconnections are formed by overcoating the upper surface of said ribbon containing said pads and an upper surface of said channel containing said exposed ends with a first adjacent and a second next adjacent dielectric layers,
forming via holes and said first layer in registration with said conductor ends and bonding pads and forming channels in said second layer interconnecting selected via holes,
filling said holes and channels with metal, and further comprising,
encapsulating entire assemblies of single dies with supporting channel segments and arrays of lead-in conductors in an epoxy encapsulant with lead-out conductors extending therefrom,
said channel material and dielectric layers being made of polyester.

* * * * *